(12) United States Patent
Wei et al.

(10) Patent No.: US 11,690,214 B2
(45) Date of Patent: Jun. 27, 2023

(54) DYNAMIC RANDOM ACCESS MEMORY AND METHOD FOR MANUFACTURING THE SAME

(71) Applicant: Winbond Electronics Corp., Taichung (TW)

(72) Inventors: Hung-Yu Wei, Taichung (TW); Pei-Hsiu Peng, Taichung (TW); Wei-Che Chang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/481,772

(22) Filed: Sep. 22, 2021

(65) Prior Publication Data

US 2022/0216210 A1 Jul. 7, 2022

(30) Foreign Application Priority Data

Jan. 5, 2021 (TW) ................................ 110100250

(51) Int. Cl.
*H10B 12/00* (2023.01)
*H01L 29/06* (2006.01)

(52) U.S. Cl.
CPC ....... *H10B 12/315* (2023.02); *H01L 29/0649* (2013.01); *H10B 12/482* (2023.02); *H10B 12/488* (2023.02)

(58) Field of Classification Search
CPC ......... H01L 27/10891; H01L 27/10814; H01L 29/0649; H01L 27/10685; H01L 29/4236; H10B 12/815; H10B 15/482

USPC .......................................... 257/296; 438/238
See application file for complete search history.

(56) References Cited

U.S. PATENT DOCUMENTS

| | | |
|---|---|---|
| 2016/0027727 A1 | 1/2016 | Kim et al. |
| 2016/0247711 A1 | 8/2016 | Kim |
| 2017/0005097 A1 | 1/2017 | Kim et al. |
| 2020/0388618 A1* | 12/2020 | Ikeda ................ H01L 27/10814 |
| 2021/0066466 A1* | 3/2021 | Kwon et al. ........ H01L 29/4236 |
| 2022/0173107 A1* | 6/2022 | Moon et al. ...... H01L 27/10823 |

FOREIGN PATENT DOCUMENTS

CN        105719998 A        6/2016

* cited by examiner

*Primary Examiner* — Thinh T Nguyen
(74) *Attorney, Agent, or Firm* — Muncy, Geissler, Olds & Lowe, P.C.

(57) ABSTRACT

A dynamic random access memory (DRAM) and its manufacturing method are provided. The DRAM includes a buried word line, a bit line, a bit line contact structure, a capacitive contact structure, and an air gap structure. The buried word line is formed in the substrate and extends along a first direction. The bit line is formed on the substrate and extends along a second direction. The bit line contact structure is formed below the bit line. The capacitive contact structure is adjacent to the bit line and surrounded by the air gap structure. The air gap structure includes a first air gap and a second air gap respectively located on a first side and a second side of the capacitive contact structure. The first air gap exposes a shallow trench isolation structure in the substrate. The second air gap exposes a top surface of the substrate.

20 Claims, 9 Drawing Sheets

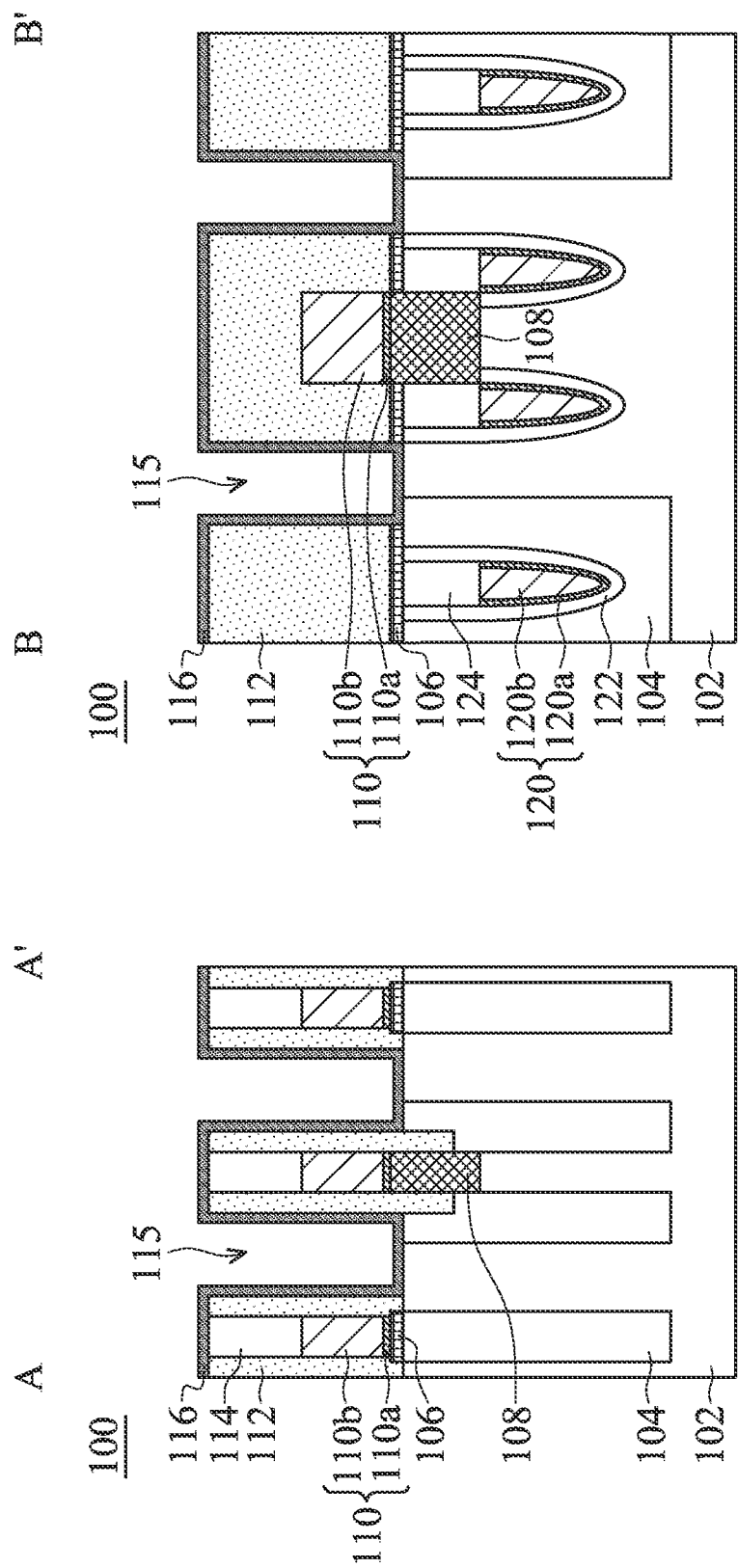

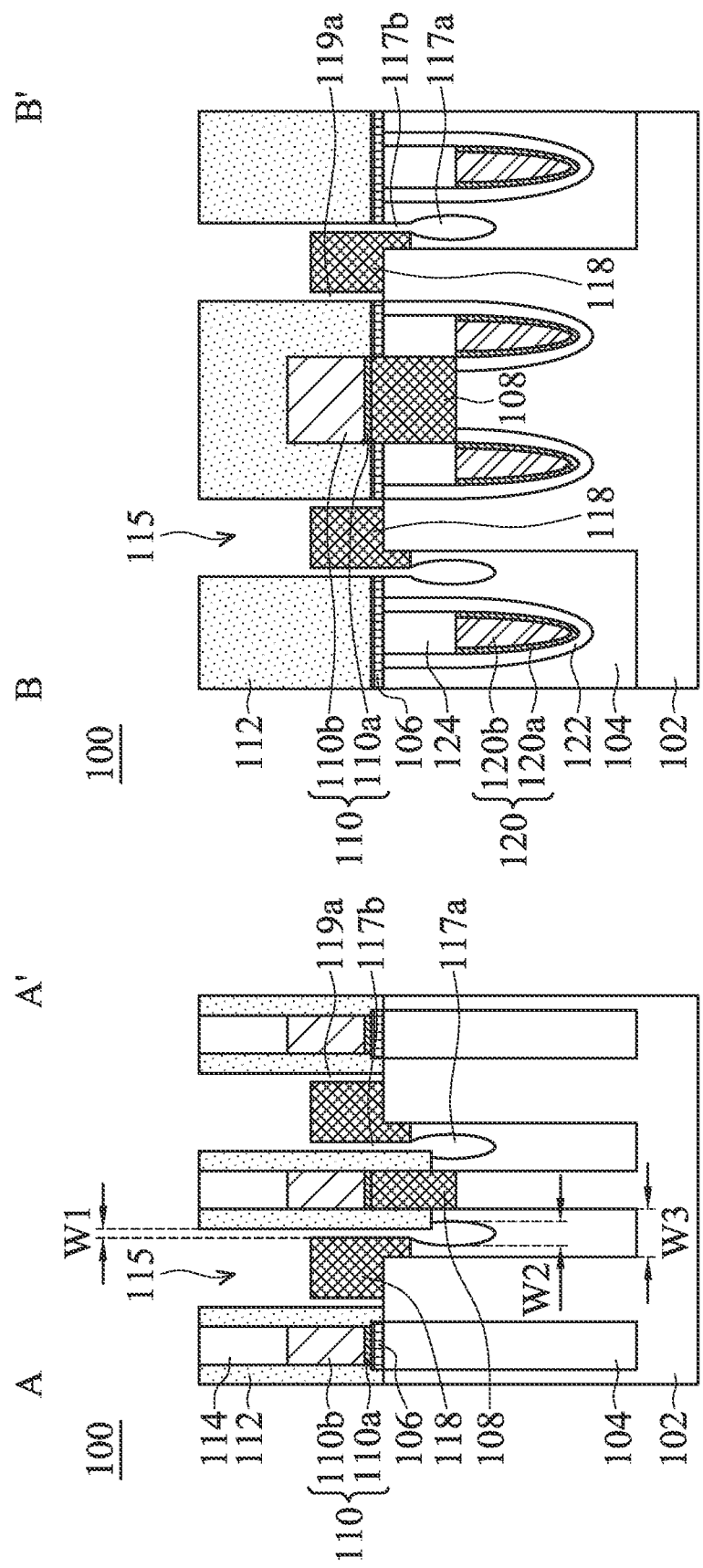

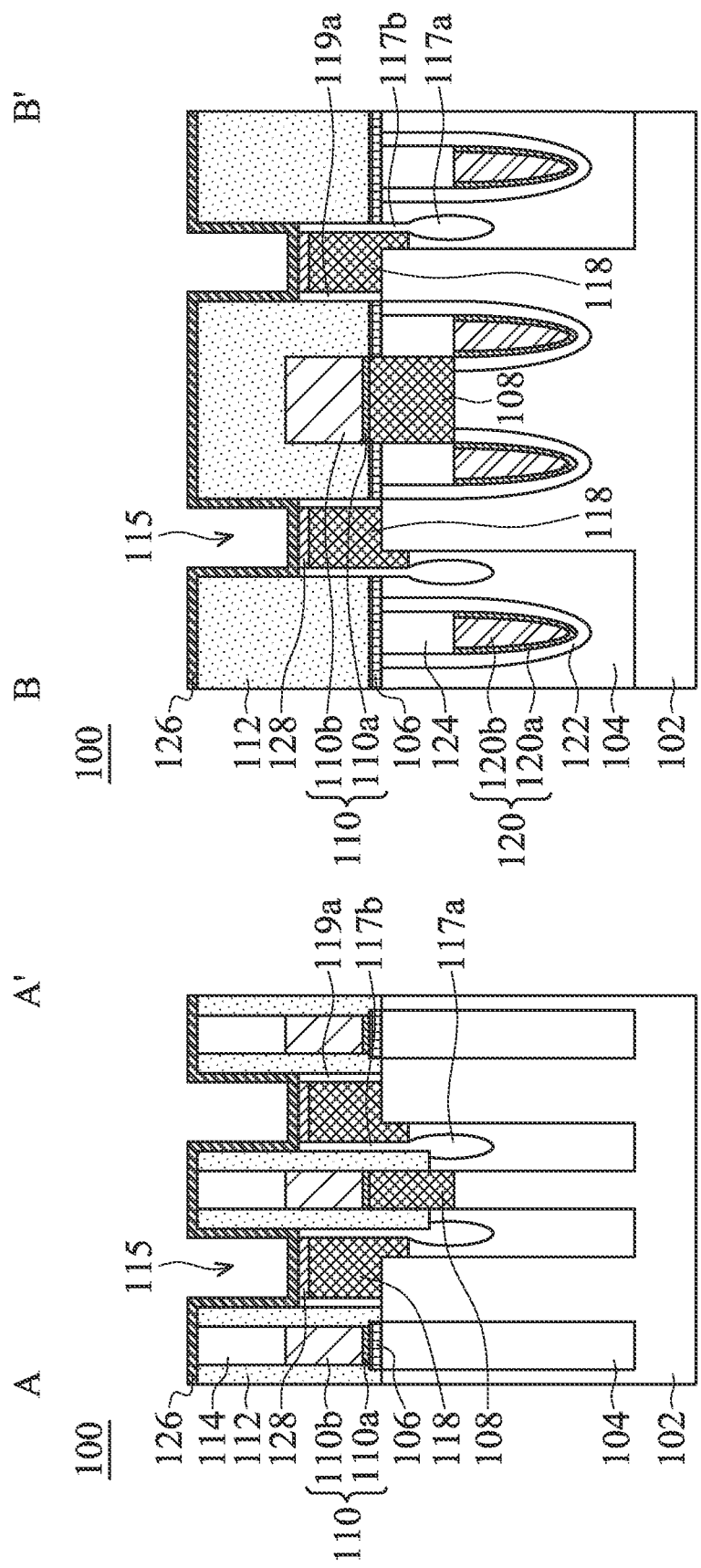

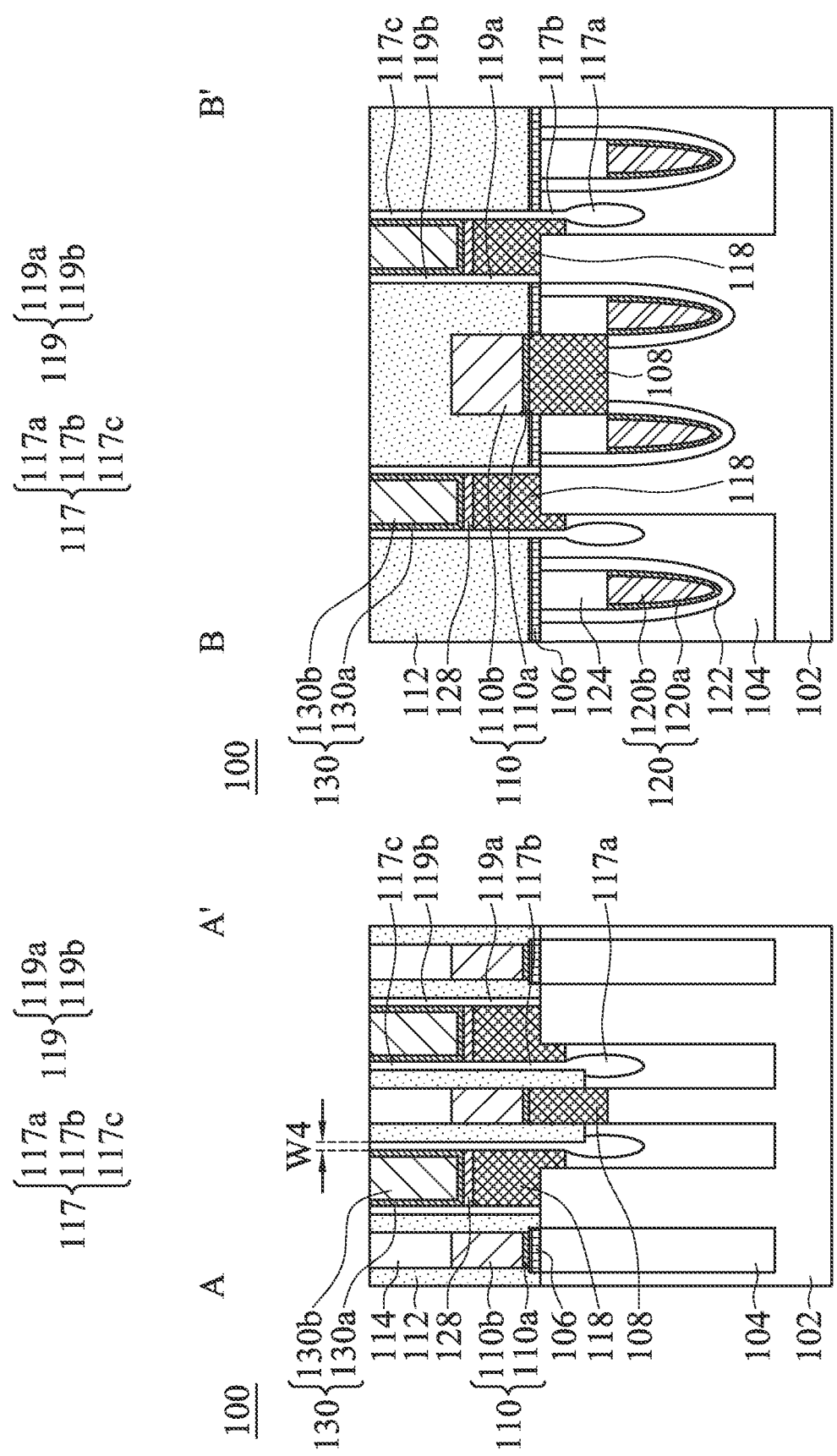

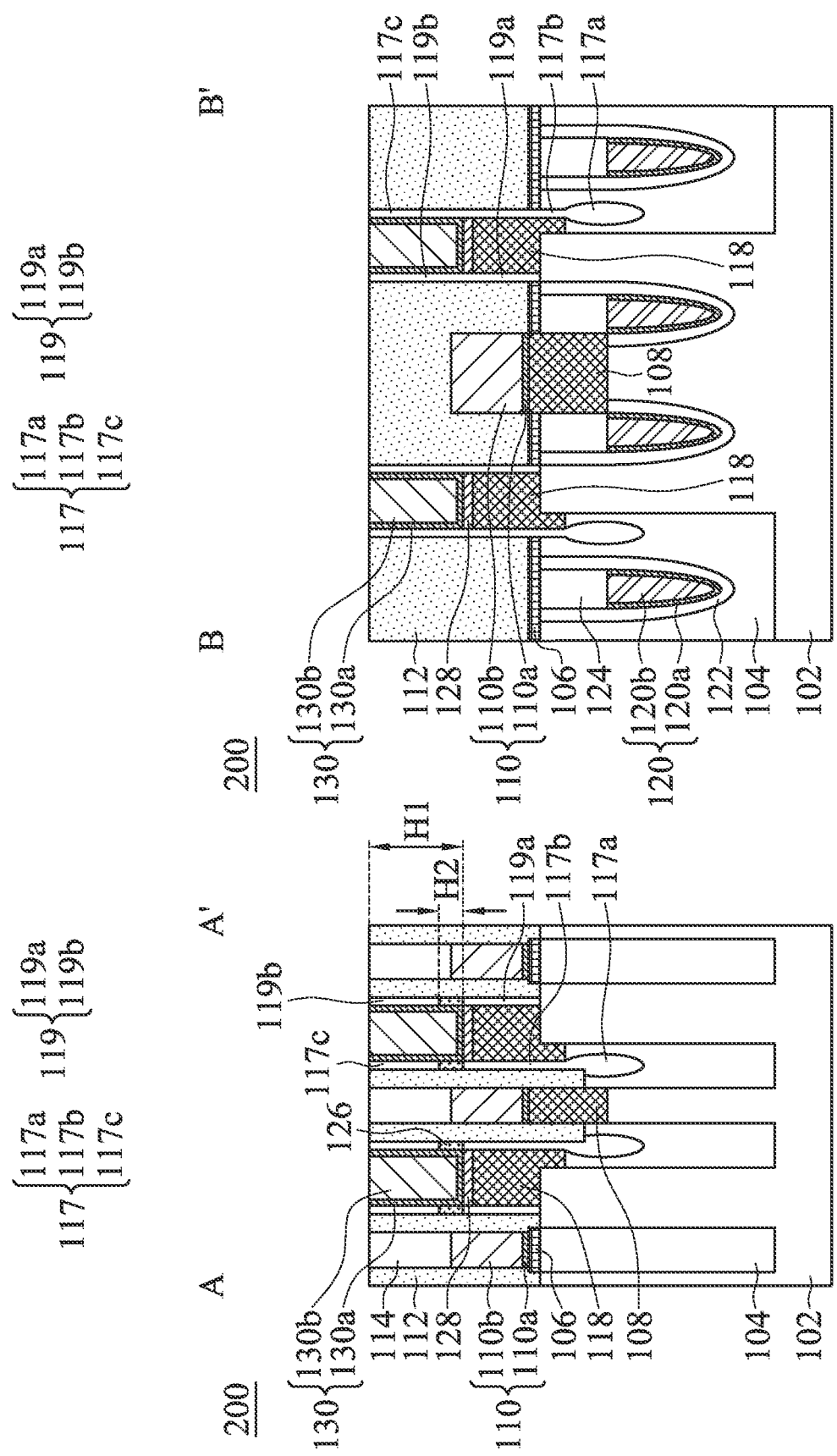

DYNAMIC RANDOM ACCESS MEMORY AND METHOD FOR MANUFACTURING THE SAME

CROSS REFERENCE TO RELATED APPLICATIONS

This Application claims priority of Taiwan Patent Application No. 110100250 filed on Jan. 5, 2021, the entirety of which are incorporated by reference herein.

BACKGROUND

Technical Field

The present disclosure is related to a memory device, and in particular it is related to a dynamic random access memory and a method for manufacturing the same.

Description of the Related Art

In dynamic random access memory (DRAM), parasitic capacitance occurs between the bit line and the adjacent capacitive contact structure. If the parasitic capacitance is too large, it will be difficult to distinguish between 0 and 1, and the writing rate will be decreased. As a result, the performance and yield of the product will be decreased. With the scaling down of memory device, the distance between the bit line and the adjacent capacitive contact structure will become smaller. Therefore, the problems with parasitic capacitance as described above will become more serious.

Parasitic capacitance may be reduced by decreasing the height (or thickness) of the bit line. However, this will increase the resistance of the bit line. As a result, it will have an impact on the operation of the memory device and reduce the performance of the product. On the other hand, the parasitic capacitance may be decreased by shortening the length of the bit line. However, the bit numbers per bit line will be decreased. Accordingly, the chip area will become larger, which is detrimental to the scaling down of the memory device. Thus, there is still a need in the art for memory devices and their fabrication methods with high performance and high yields.

BRIEF SUMMARY

The present disclosure provide a dynamic random access memory device and a manufacturing method that may reduce the parasitic capacitance between the bit line and the adjacent capacitive contact structure, and may improve the performance, yield and reliability of the memory device.

A dynamic random access memory includes a buried word line in a substrate, wherein the buried word line extends along a first direction; a bit line on the substrate, wherein the bit line extends along a second direction, which is perpendicular to the first direction; a bit line contact structure below the bit line; a capacitive contact structure adjacent to the bit line; and an air gap structure surrounding the capacitive contact structure, wherein the air gap structure includes a first air gap at a first side of the capacitive contact structure, wherein the first air gap exposes a shallow trench isolation structure in the substrate; and a second air gap at a second side of the capacitive contact structure, wherein the second air gap exposes a top surface of the substrate.

A manufacturing method for forming a dynamic random access memory includes forming a buried word line in a substrate, wherein the buried word line extends along a first direction; forming a bit line on a substrate, wherein the bit line extends along a second direction, which is perpendicular to the first direction; forming a bit line contact structure below the bit line; forming a capacitive contact structure adjacent to the bit line; and forming an air gap structure surrounding the capacitive contact structure, wherein the air gap structure includes a first air gap at a first side of the capacitive contact structure, wherein the first air gap exposes a shallow trench isolation structure in the substrate; and a second air gap at a second side of the capacitive contact structure, wherein the second air gap exposes a top surface of the substrate.

The manufacturing method for forming a dynamic random access memory provides a formation for air gap structure surrounding by the capacitive contact structure. Since air has a lower dielectric constant than a general dielectric material, the parasitic capacitance between the bit line and the capacitive contact structure may be significantly decreased. Furthermore, the air gap structure that extends into the shallow trench isolation structure may decrease the resistance of the bit line contact structure and the capacitive contact structure, and may further decrease the parasitic capacitance. As a result, the writing rate of the memory device may be increased and the performance of the memory device may be greatly improved. In addition, the air gap structure into the shallow trench isolation structure may also reduce the gate-induced drain leakage current (GIDL). Therefore, the reliability of the memory device may be improved.

BRIEF DESCRIPTION OF THE DRAWINGS

FIGS. 2A, 2B, 3A, 3B, 4A, 4B, 5A, 5B, 6A, 6B, 7A, 7B, 8A, and 8B illustrate cross-sectional views of a dynamic random access memory at various stages according to some embodiments of the present disclosure.

FIGS. 9A and 9B illustrate cross-sectional views of a dynamic random access memory at various stages according to other embodiments of the present disclosure.

DETAILED DESCRIPTION

Figure 1:
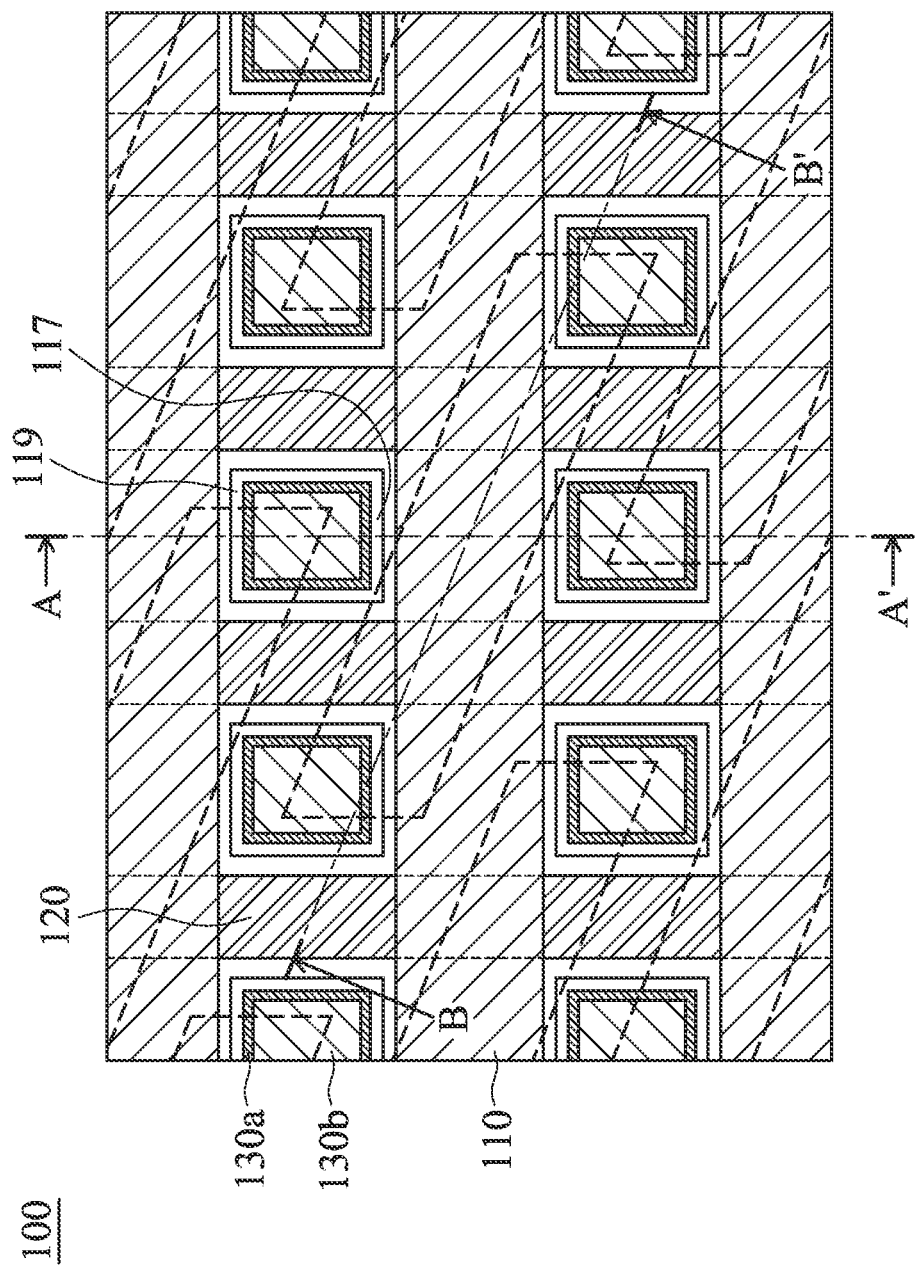
FIG. 1 illustrates a top view of a dynamic random access memory according to some embodiments of the present disclosure.

The present disclosure provides a memory device and a manufacturing method thereof. For the simplicity of discussing, FIG. 1 only illustrates the bit lines 110, the buried word line 120, the second contact feature 130 (i.e., the fifth conductive layer 130a and the sixth conductive layer 130b), the first air gap 117, and the second air gap 119. FIGS. 2A, 3A, 4A, 5A, 6A, 7A, and 8A are cross-sectional views along the section line AA' of FIG. 1. FIGS. 2B, 3B, 4B, 5B, 6B, 7B, and 8B are cross-sectional views along the section line BB' of FIG. 1.

Referring to FIG. 1, along with FIGS. 2A and 2B, a shallow trench isolation structure 104 is formed in the substrate 102. The material of the substrate 102 may include silicon, silicon-containing semiconductor, silicon-on-insulator (SOI), other suitable materials, or a combination thereof. In some embodiments, other structures may also be formed in the substrate 102. For example, p-well region, n-well region, or conductive region (not shown) may be formed in the substrate 102 by an implant process.

Referring to FIG. 2B, a buried word line 120 is then formed in the substrate 102. In detail, a mask layer (not shown) may be formed to cover the substrate 102. The mask layer and the substrate 102 may be patterned to form the word line trenches in the substrate 102. The insulating liner layer 122 is conformally formed in the word line trenches. Next, a first conductive layer 120a is conformally formed in the word line trenches. Then, a second conductive layer 120b is formed to fill the word line trenches. Next, the first conductive layer 120a and the second conductive layer 120b are etched to a desired thickness by an etching back process. The material of the insulating liner layer 122 may include oxide, nitride, nitrogen oxide, carbide, other suitable insulating materials, or a combination thereof. In this embodiment, the material of the insulating liner layer 122 is silicon oxide.

Throughout the present disclosure, the first conductive layer 120a and the second conductive layer 120b are collectively referred to as the "buried word line 120". A plurality of buried word lines 120 are formed in the substrate 102, which are parallel to each other, and the buried word lines 120 extend in the first direction, as illustrated in FIG. 1. The material of the first conductive layer 120a may include titanium, titanium nitride, tungsten nitride, tantalum or tantalum nitride, other suitable conductive materials, or a combination thereof. The material of the second conductive layer 120b may include tungsten, aluminum, copper, gold, silver, an alloy thereof, other suitable metallic materials, or a combination thereof. In this embodiment, the first conductive layer 120a is titanium nitride, and the second conductive layer 120b is tungsten. The first conductive layer 120a and the second conductive layer 120b may be formed separately and independently by a chemical vapor deposition (CVD) process, a physical vapor deposition (PVD) process, an atomic, layer deposition (ALD) process, other suitable deposition processes, or a combination thereof.

Referring to FIG. 2B, a dielectric material is then filled into the word line trenches and the excess dielectric material is removed by a planarization process to form a first dielectric layer 124 in the word line trenches. The material of the first dielectric layer 124 may include oxide, nitride, nitrogen oxide, other suitable dielectric material, or a combination thereof. In this embodiment, the first dielectric layer 124 is silicon nitride.

Referring to FIG. 1, along with FIGS. 2A and 2B, a first insulating layer 106 is formed on the substrate 102, and then the first insulating layer 106 and the substrate 102 are patterned to define an opening. After that, a conductive material is formed to till the opening and form the bit line contact structure 108. Next, a planarization process (e.g., a chemical-mechanical polishing (CMP) process) is performed optionally such that the top surface of the bit line contact structure 108 is level with the top surface of the first insulating layer 106. The material of the first insulating layer 106 may include oxide, nitride, nitrogen oxide, carbide, other suitable insulating materials, or a combination thereof. In this embodiment, the first insulating layer 106 is silicon nitride. The material of the bit line contact structure 108 may include doped polycrystalline silicon, other suitable conductive materials, or a combination thereof.

A third conductive layer 110a, a fourth conductive layer 110b, and a second dielectric layer 114 are sequentially formed on the substrate 102. Next, the third conductive layer 110a, the fourth conductive layer 110b, and the second dielectric layer 114 are patterned to define the bit lines 110. The material of the second dielectric layer 114 may be the same as or similar to the material of the first dielectric layer 124.

Throughout the present disclosure, the third conductive layer 110a and the fourth conductive layer 110b are collectively referred to as the "bit lines 110". A plurality of bit lines 110 are formed on the substrate 102, which are parallel to each other, and the bit lines 110 extend in a second direction, which is perpendicular to the first direction, as illustrated in FIG. 1. The material and forming method of the third conductive layer 110a may be the same as or similar to the material and forming method of the first conductive layer 120a. The material and forming method of the fourth conductive layer 110b may be the same as or similar to the material and forming method of the second conductive layer 120b. Each of the bit line contact structure 108 is located below the bit lines 110. In this embodiment, the third conductive layer 110a is titanium nitride, and the fourth conductive layer 110b is tungsten.

The insulating spacer 112 is formed over the bit lines 110 and the bit line contact structure 108. Next, the insulating spacer 112 may be patterned to form a plurality of openings 115 adjacent to the bit lines 110. Each of the openings 115 is between the adjacent bit lines 110 and between the adjacent buried word lines 120.

The material of the insulating spacer 112 may include oxide, nitride, nitrogen oxide, other suitable dielectric materials, or a combination thereof. The insulating spacer 112 may be a single-layer structure formed by a single material or a multi-layer structure formed by a plurality of different materials. In this embodiment, the insulating spacer 112 is a single-layer structure formed by silicon nitride. In other embodiments, the insulating spacer 112 is a double-layer structure formed by silicon nitride and silicon oxide.

A first liner layer 116 is conformity formed in the openings 115. The material of the first liner layer 116 may include oxide, nitrogen oxide, other suitable materials, or a combination thereof. In this embodiment, the first liner layer 116 is silicon oxide. The first liner 116 may be formed by a CVD process, a PVD process, an ALD process, other suitable deposition processes, or a combination thereof. In this embodiment, the first liner 116 is formed by an ALD process. Therefore, the thickness and cross-sectional profile of the first liner 116 may be precisely controlled to facilitate the subsequent formation of the air gap.

Figure 3A:
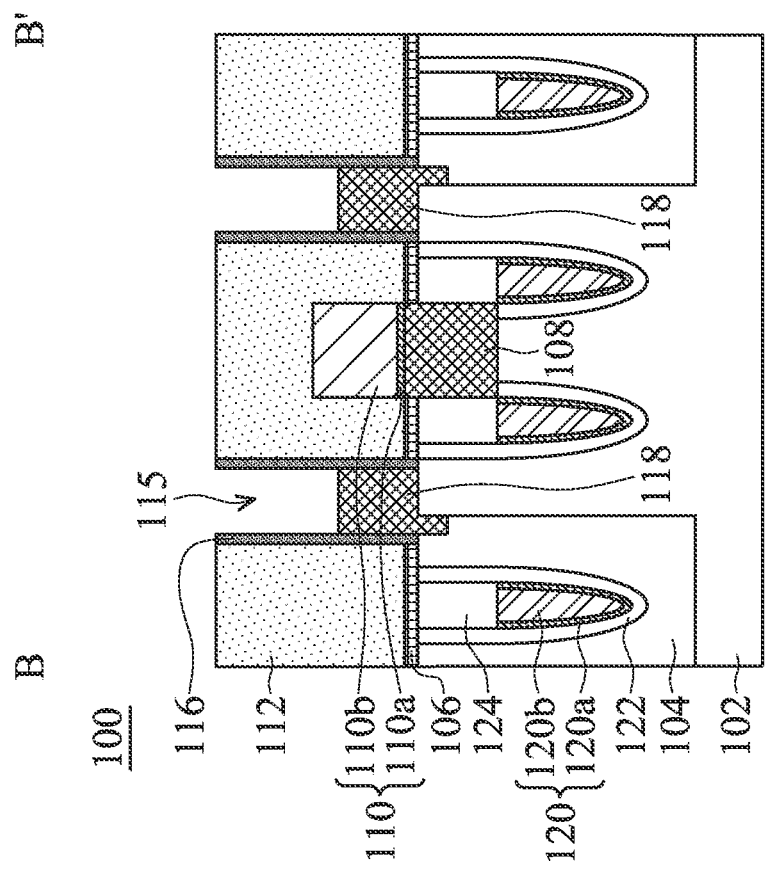
Figure 3B:
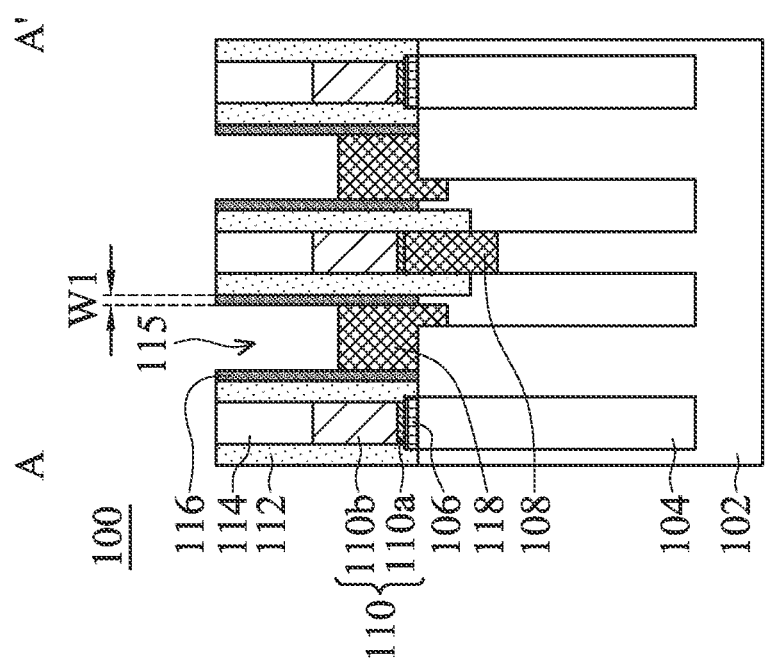

Referring to FIG. 1, along with FIGS. 3A and 3B, a first etching process is performed to remove a portion of the first liner layer 116 and a portion of the shallow trench isolation structure 104. In particular, the first liner layer 116 on the insulating spacer 112 and at the bottom of the openings 115 is removed, and the shallow trench isolation structure 104 exposed at the bottom of the openings 115 is also partially removed. Thus, the bottom of the openings 115 extends into the shallow trench isolation structure 104. After the first etching process, the first contact feature 118 is formed in the openings 115 and a portion of the first contact feature 118 extends into the shallow trench isolation structure 104. Compared to the situations where the first etching process does not remove the shallow trench isolation structure 104, in FIGS. 3A and 3B, the contact area between the first contact feature 118 and the substrate 102 may be increased, and the resistance between the first contact feature 118 and the substrate 102 may be decreased.

The material and method of forming the first contact feature 118 may be the same or similar to the material and method of forming the bit line contact structure 108. In this embodiment, the material of the first contact feature 118 is doped polycrystalline silicon in order to adjust the work function and resistance within a suitable range.

The first etching process may be an anisotropic etching process. In this embodiment, the first etching process is a dry etching process. During the first etching process, the removal rate of the first liner layer 116 is much greater than the removal rate of the substrate 102. Thus, the first liner 116 at the bottom of the openings 115 may be completely removed while maintaining the shape of the active region of the substrate 102 (i.e., the portion of the substrate 102 that does not form the shallow trench isolation structure 104). Further, during the first etching process, the removal rate of the first liner 116 may be the same or similar to the removal rate of the shallow trench isolation structure 104. Accordingly, it is possible to partially remove the shallow trench isolation structure 104 exposed at the bottom of the openings 115 while maintaining the shape of the active region of the substrate 102.

Referring to FIG. 1, along with FIGS. 4A and 4B, a second etching process is performed to completely remove the remaining first liner layer 116 and partially remove the shallow trench isolation structure 104. Additionally, a portion of the shallow trench isolation structure 104 below the first liner layer 116 is removed, and an air gap structure is formed in the shallow trench isolation structure 104. After the second etching process, an air gap structure is formed around the first contact feature 118.

Referring to FIG. 1, along with FIGS. 5A and 5B, a buffer layer 128 is formed on the first contact feature 118. Next, a second liner layer 126 is conformally formed in the openings 115 and the second liner layer 126 covers the buffer layer 128. A metal silicidation reaction may be performed to form the buffer layer 128 on the top surface of the first contact feature 118. For example, a metal (e.g., cobalt, tungsten, nickel, other suitable metals, or a combination thereof) may be deposited on the top surface of the first contact feature 118, followed by annealing at a specific temperature to react the metal with the silicon to form a metal silicide. The metal silicide is the material that forms the buffer layer 128.

The material and method of formation of the second liner layer 126 may be the same or similar to the material and method of formation of the first liner layer 116. In this embodiment, the second liner layer 126 is silicon oxide and is formed by an ALD process. Thus, the thickness and cross-sectional profile of the second liner layer 126 may be precisely controlled and may prevent the second liner layer 126 from entering the air gap that is surrounding the first contact feature 118. In this embodiment, the bottom surface of the second liner layer 126 is higher or level with the bottom surface of the buffer layer 128.

Figures 6A, 6B:
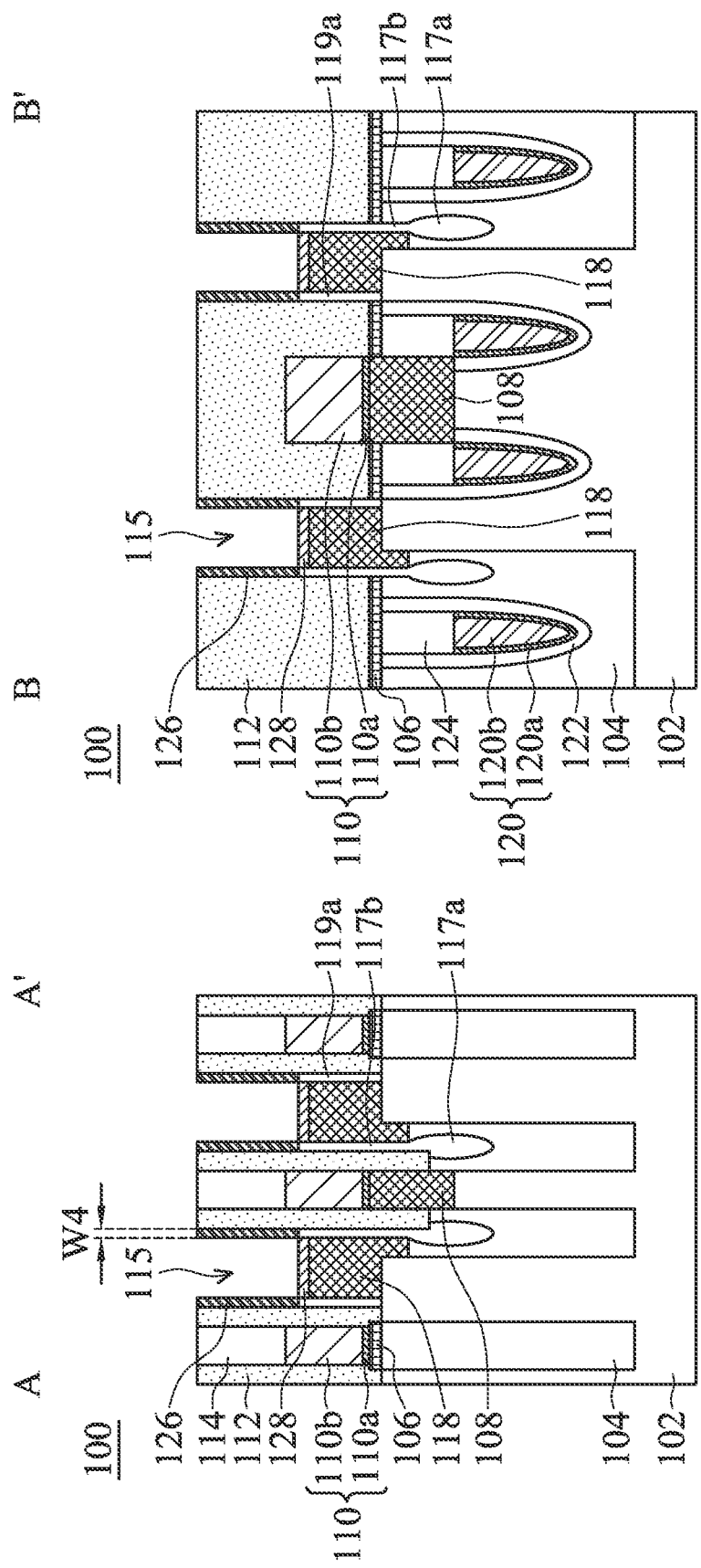

Referring to FIG. 1, along FIGS. 6A and 6B, a third etching process is performed to remove a portion of the second liner layer 126. In more detail, the second liner layer 126 on the insulating spacer 112 and at the bottom of the openings 115 is removed and the top surface of the buffer layer 128 is exposed. The third etching process may be an anisotropic etching process and may be the same as or similar to the first etching process.

Referring to FIG. 1, along with FIGS. 7A and 7B, a second contact feature 130 is formed on the buffer layer 128. More specifically, a fifth conductive layer 130a, is conformity formed in the openings 115. Next, a sixth conductive layer 130b is formed to fill the openings 115, and the excess fifth conductive layer 130a and sixth conductive layer 130b are removed by a planarization process to expose the insulating spacer 112, the second dielectric layer 114, and the second liner layer 126.

Throughout the present disclosure, the fifth conductive layer 130a and the sixth conductive layer 130b are collectively referred to as the "second contact feature 130". The material and method of forming the fifth conductive layer 130a may be the same as or similar to the material and method of forming the first conductive layer 120a. The material and formation method of the sixth conductive layer 130b may be the same as or similar to the material and formation method of the second conductive layer 120b. The material of the first contact feature 118 may be different from the material of the second contact feature 130 in order to adjust the work function and resistance within a suitable range. In this embodiment, the fifth conductive layer 130a is titanium nitride, and the sixth conductive layer 130b is tungsten.

Then, a fourth etching process is performed to completely remove the remaining second liner layer 126. After the fourth etching process, an air gap structure is formed from surrounding the first contact feature 118, the buffer layer 128, and the second contact feature 130. The fourth etching process may be a dry etching process, a wet etching process, or a combination thereof. In some embodiments, the fourth etching process is a dry etching process. Thus, the etching depth may be precisely controlled. In other embodiments, the fourth etching process is a wet etching process. Thus, the damage to the top surface of the second contact feature 130 may be reduced.

Figures 8A, 8B:
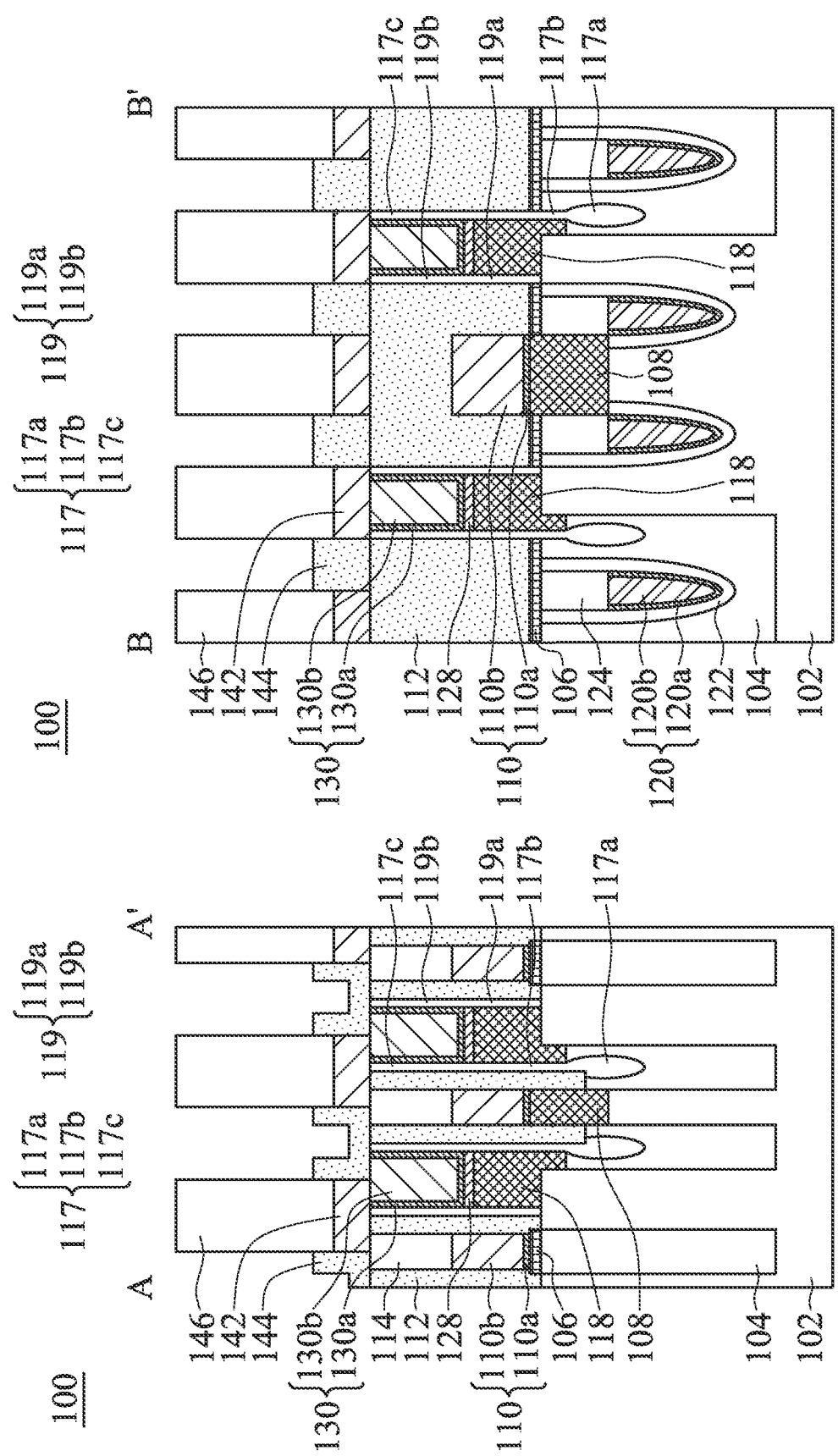

Referring to FIG. 1, along with FIGS. 8A and 8B, after forming and patterning the landing pad 142, a second insulating layer 144 is then formed to cover the entire topmost portion of the substrate 102. Next, the second insulating layer 144 is patterned to form a plurality of openings that expose the landing pad 142. Then, a capacitive structure 146 is formed in these openings on the second contact feature 130. The capacitive structure 146 is electrically connected to the second contact feature 130 by the landing pad 142.

The material and method of forming the second insulating layer 144 may be the same as or similar to the material and method of forming the first insulating layer 106. The material and method of forming the landing pad 142 may be the same as or similar to the material and method of forming the second conductive layer 120b. The capacitive structure 146 may have a well-known structure and be formed by a well-known method, and is not described in detail herein. Since the first contact feature 118, the buffer layer 128, and the second contact feature 130 are electrically connected to the capacitive structure 146, the first contact feature 118, the buffer layer 128, and the second contact feature 130 are collectively referred to as the "capacitive contact structure" throughout the present disclosure.

After forming the capacitive structure 146, other well-known processes ma be subsequently performed to complete the dynamic random access memory 100. For the sake of brevity, other well-known processes will not be described in detail herein.

A dynamic random access memory 100 is provided in accordance with some embodiments. Referring to FIG. 1, along with FIGS. 8A and 8B, the dynamic random access memory 100 includes a substrate 102, a shallow trench isolation structure 104, a plurality of bit lines 110, a plurality of buried word lines 120, a plurality of bit line contact structures 108, a plurality of insulating spacers 112, a plurality of capacitive contact structures, and a plurality of air gap structures.

The buried word lines 120 that are parallel to each other are formed in the substrate 102 and extend in a first direction. The bit lines 110 that are parallel to each other are formed on the substrate 102 and extend in a second direction, which is perpendicular to the first direction. A bit line contact structure 108 is formed below the bit lines 110. An insulating spacer 112 is formed on the sidewall of the bit line contact structure 108, and the insulating spacer 112 is disposed between the bit lines 110 and the capacitive contact structures 108. Each of the capacitive contact structures 108 includes a first contact feature 118, a buffer layer 128, and a second contact feature 130, which are sequentially formed on the substrate 102. The capacitive contact structures are adjacent to the bit lines 110. Each of the capacitive contact structures is disposed between two adjacent bit lines 110 and between two adjacent buried word lines 120. Each of the capacitive contact structures is surrounded by an air gap structure. Each of the air gap structures includes a first air gap 117 and a second air gap 119 connected to each other. The first air gap 117 is on a first side of the capacitive contact structure, and the first air gap 117 exposes a shallow trench isolation structure 104 disposed in the substrate 102. The second air gap 119 is on a second side of the capacitive contact structure, and the second air gap 119 exposes a top surface of the substrate 102.

The air gap structure (i.e., the first air gap 117 and the second air gap 119) surrounds the capacitive contact structure (i.e., the first contact feature 118, the buffer layer 128, and the second contact feature 130) from top to bottom. Since air has a lower dielectric constant than a general dielectric material, the air gap structure may significantly decrease the parasitic capacitance between the bit lines (and/or the bit line contact structures) and the capacitive contact structure compared to a dielectric layer having the same thickness. As a result, the writing rate of the memory device may be increased and the performance of the memory device may be significantly improved. In addition, the air gap structure with a smaller thickness may significantly decrease the parasitic capacitance compared to using a dielectric layer. Therefore, it facilitates the scaling down of memory device.

In order to decrease the resistance of the bit line contact structure 108, the bottom surface of the bit line contact structure 108 is lower than the bottom surface of the insulating spacer 112. In order to decrease the resistance of the first contact feature 118, the second bottom surface of the first contact feature 118 is lower than the top surface of the substrate 102 on the first side of the capacitive contact structure, and the first bottom surface of this first contact feature 118 is level with the top surface of the substrate 102 on the second side of the capacitive contact structure, which may increase the contact area of the first contact feature 118 with the substrate 102.

Referring to FIG. 8A, the first air gap 117 includes a first portion 117a, a second portion 117b, and a third portion 117c. The first portion 117a is formed in the substrate 102 and extends down into the shallow trench isolation structure 104. The second portion 117b is formed on the substrate 102 and it extends up to a position equal to or lower than the top surface of the buffer layer 128. A third portion 117c is formed on the second portion 117b and extends up to a position equal to or lower than the top surface of the second contact feature 130. The second air gap 119 includes a first portion 119a and a second portion 119b. The first portion 119a is formed on the substrate 102 and it extends up to a position equal to or lower than the top surface of the buffer layer 128. The second portion 119b is formed on the first portion 119a and it extends up to a position equal to or lower than the top surface of the second contact feature 130.

In order to further reduce the parasitic capacitance between the bit line contact structure 108 and the capacitive contact structure, the bottom surface of the first air gap 117 (i.e., the bottom surface of the first portion 117a) is lower than the bottom surface of the capacitive contact structure (i.e., the bottom surface of the first contact feature 118), and is lower than the bottom surface of the insulating spacer 112 and the bottom surface of the bit line contact structure 108. In other embodiments, the bottom surface of the first air gap 117 is level with the bottom surface of the insulating spacer 112 or the bottom surface of the bit line contact structure 108.

Referring to FIG. 3A, along with FIG. 4A, in this embodiment, the second etching process is a wet etching process. During the second etching process, the removal rate of the first liner layer 116 is much greater than the removal rate of the first contact feature 118. Therefore, the first liner layer 116 disposed on the sidewall of the opening 115 may be completely removed while maintaining the shape of the first contact feature 118. Further, the removal rate of the first liner 116 may be the same or similar to the removal rate of the shallow trench isolation structure 104. Thus, it is possible to partially remove the shallow trench isolation structure 104 to form the first portion 117a of the first air gap 117. Furthermore, the removal rate of the first liner layer 116 is much greater than the removal rate of the substrate 102. Thus, it is possible to avoid the etching solution from entering the substrate 102 through the bottom of the second air gap 119 or the sidewall of the shallow trench isolation structure 104. In this way, damage to other components in the substrate 102 may be avoided, and the yield of the memory device may be further improved.

Referring to FIG. 3A, along with FIG. 4A, after the first etching process, the first liner layer 116 has a first width W1. The second portion 117b of the first air gap 117 has a shape corresponding to the first liner layer 116. Thus, after the second etching process, the second portion 117b of the first air gap 117 has a first width W1, and the second portion 117b substantially has a uniform width from the top to the bottom (i.e., the first width W1). Referring to FIG. 4A, the first portion 117a of the first air gap 117 has a first width W1 from a position at the top surface of the substrate 102 to a position above the bottom surface of the first contact feature 118. At a position below the bottom surface of the insulating spacer 112, the first portion 117a of the first air gap 117 has a maximum width W2. In some embodiments, the cross-sectional profile of the first portion 117a that is widened may be approximately elliptical. In other embodiments, the cross-sectional profile of the sidewalls of the first portion 117a that is widened may be approximately spherical, diamond-shaped, or irregularly shaped.

If the first width W1 of the first liner layer 116 is large enough, the first air gap 117 and the second air gap 119 may be formed wide enough, and the parasitic capacitance and gate-induced drain leakage current (GIDL) between the bit line contact structure 108 and the capacitive contact structure may be effectively decreased. On the other hand, if the first width W1 of the first liner layer 116 is small enough, it may prevent the metal material that forms the buffer layer 128 from entering the air gap structure. In some embodiments, the first width W1 of the first liner layer 116 is 1%-10% of the width of the bit line contact structure 108. In other embodiments, the first width W1 of the first liner layer 116 is 3%-5% of the width of the bit line contact structure 108. In some embodiments, the first width W1 of the first liner layer 116 is 2-10 nm. In other embodiments, the first width W1 of the first liner layer 116 is 4-6 nm.

If the maximum width W2 of the first portion 117a is large enough, the parasitic capacitance and GIDL between the bit line contact structure 108 and the capacitive contact structure may be effectively decreased. On the other hand, if the maximum width W2 of the first portion 117a is small enough, it may prevent the components on opposite sides of the first air gap 117 from being warped or damaged by stress. In other words, by adjusting the ratio W2/W1 of the maximum width W2 to the first width W1 to a specific range, the yield, performance and reliability of the memory device may be further improved. In some embodiments, the maximum width W2 is greater than the first width W1. In some embodiments, the maximum width W2 has a ratio W2/W1 of 1.2-5.0 with respect to the first width W1. In other embodiments, the maximum width W2 has a ratio W2/W1 of 2.0-4.0 with respect to the first width W1.

Referring to FIG. 4A, the shallow trench isolation structure 104 has a third width W3 at a location corresponding to the maximum width W2 of the first portion 117a. If the first portion 117a extends laterally beyond the shallow trench isolation structure 104, the components on opposite sides of the first air gap 117 may be warped or damaged by stress. Further, the etching solution of the second etching process may also enter the substrate 102 and damage other components. Therefore, the maximum width W2 of the first portion 117a may be controlled to be less than the third width W3.

Referring to FIG. 6A, along with FIG. 7A, after the third etching process, the second liner layer 126 has a fourth width W4. The third portion 117c of the first air gap 117 has a shape corresponding to the second liner layer 126. Thus, after the third etching process, the third portion 117c of the first air gap 117 has a fourth width W4, and the third portion 117c substantially has a uniform width from the top to the bottom (i.e., the fourth width W4). If the fourth width W4 of the second liner layer 126 is large enough, it may prevent the conductive material that forms the fifth conductive layer 130a and the sixth conductive layer 130b from entering the air gap structure. On the other hand, if the fourth width W4 of the second liner layer 126 is small enough, a second contact feature 130 with a large enough area may be formed and the resistance between the second contact feature 130 and the capacitive structure may be effectively decreased. In some embodiments, the fourth width W4 has a ratio W4/W1 of 1.0-4.0 with respect to the first width W1. In other embodiments, the fourth width W4 has a ratio W4/W1 of 1.5-2.0 with respect to the first width W1.

Referring to FIG. 7A, the fourth width W4 is substantially equal to the first width W1. In other words, at a position from the top surface of the second contact feature 130 to the top surface of the substrate 102, the first air gap 117 and the second air gap 119 both have uniform widths. The entire sidewall of the capacitive contact structure is completely surrounded by the air gap structure. In this way, the parasitic capacitance between the bit lines 110 and the capacitive contact structure may be significantly decreased.

FIGS. 9A and 9B are similar to FIGS. 7A and 7B, respectively. In FIGS. 9A and 9B, the same components as illustrated in FIGS. 7A and 7B are denoted by the same reference numerals. For the sake of brevity, the components and their formation process steps, which are the same as those illustrated in FIGS. 7A and 7B, are not described in detail herein.

The dynamic random access memory 200 illustrated in FIGS. 9A and 9B is similar to the dynamic random access memory 100 illustrated in FIGS. 7A and 7B, except that the second liner layer 126 illustrated in FIGS. 9A and 9B is not completely removed. A portion of the second substrate 126 may be removed by a fourth etching process after the second contact feature 130 is formed, resulting in the structure illustrated in FIGS. 9A and 9B. In this embodiment, the second liner layer 126 is not completely removed. Therefore, even if the fourth etching process is a wet etching process, it is difficult for the etching solution to enter the substrate 102 or the shallow trench isolation structure 104.

Referring to FIG. 9A, along with FIG. 9B, a portion of the second liner layer 126 remains on the sidewall of the capacitive contact structure and surrounds the capacitive contact structure. The second liner layer 126 is between the second portion 117b of the first air gap 117 and the third portion 117c of the first air gap 117, and separates the second portion 117b from the third portion 117c from each other. The second liner layer 126 is between the first portion 119a of the second air gap 119 and the second portion 119b of the second air gap 119, and so that the first portion 119a and the second portion 119b are separated from each other. In this embodiment, the second liner layer 126 may provide a structural support function to prevent warping or damage to the components on opposite sides of the air gap structure caused by stress.

Referring to FIG. 9A, the second contact feature 130 has a first height H1 and the second liner layer 126 has a second height H2. If the second height H2 is large enough, may prevent warping or damage to the components on opposite sides of the air gap structure by stress. Thus, the yield of the memory device may be improved. On the other hand, if the second height H2 is small enough, the parasitic capacitance between the bit lines 110 and the capacitive contact structure may be effectively decreased. Therefore, the performance and reliability of the memory device may be improved. In other words, the yield, performance and reliability of the memory device may be further improved by adjusting the first height H1 to have a ratio H1/H2 to the second height H2 to a specific range. In some embodiments, the first height H1 has a ratio H1/H2 of 10.0-20.0 with respect to the second height H2. In other embodiments, the first height H1 has a ratio H1/H2 of 12.0-15.0 with respect to the second height H2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dynamic random access memory, comprising:
    a buried word line in a substrate, wherein the buried word line extends along a first direction;
    a bit line on the substrate, wherein the bit line extends along a second direction perpendicular to the first direction;
    a bit line contact structure below the bit line;
    a capacitive contact structure adjacent to the bit line; and
    an air gap structure surrounding the capacitive contact structure, wherein the air gap structure comprises:
    a first air gap at a first side of the capacitive contact structure, wherein the first air gap exposes a shallow trench isolation structure in the substrate; and
    a second air gap at a second side of the capacitive contact structure, wherein the second air gap exposes a top surface of the substrate, wherein the first air gap connects to the second air gap.

2. The dynamic random access memory as claimed in claim 1, wherein a bottom surface of the first air gap is lower than a bottom surface of the capacitive contact structure.

3. The dynamic random access memory as claimed in claim 1, wherein the capacitive contact structure comprises:
a first contact feature on the substrate, wherein the first contact feature extends into the shallow trench isolation structure at the first side;
a buffer layer on the first contact feature; and
a second contact feature on the buffer layer.

4. The dynamic random access memory as claimed in claim 3, wherein a first bottom surface of the first contact feature is lower than a top surface of the substrate at the first side, and wherein a second bottom surface of the first contact feature is level with the top surface of the substrate at the second side.

5. The dynamic random access memory as claimed in claim 3, wherein the first air gap comprises:
a first portion in the substrate, wherein the first portion extends down into the shallow trench isolation structure;
a second portion on the substrate and extended up to a position equal to or lower than a top surface of the buffer layer; and
a third portion on the second portion and extended up to a position equal to or lower than a top surface of the second contact feature.

6. The dynamic random access memory as claimed in claim 3, wherein the first air gap has a first width W1 at a position of a top surface of the substrate, the first air gap has a maximum width W2 in the shallow trench isolation structure, and the maximum width W2 is greater than the first width W1.

7. The dynamic random access memory as claimed in claim 6, wherein the maximum width W2 has a ratio W2/W1 of 1.2-5.0 with respect to the first width W1.

8. The dynamic random access memory as claimed in claim 3, wherein a bottom surface of the first air gap is level with or lower than a bottom surface of the bit line contact structure.

9. The dynamic random access memory as claimed in claim 5, further comprising:
an insulating spacer on sidewalls of the bit line contact structure, wherein the insulating spacer is between the bit line and the capacitive contact structure; and
a capacitive structure on the capacitive contact structure.

10. The dynamic random access memory as claimed in claim 9, wherein a bottom surface of the bit line contact structure is level with or lower than a bottom surface of the insulating spacer.

11. The dynamic random access memory as claimed in claim 10, wherein a bottom surface of the first air gap is level with or lower than the bottom surface of the insulating spacer.

12. The dynamic random access memory as claimed in claim 9, wherein the first portion of the first air gap laterally extends to directly below the bottom surface of the insulating spacer.

13. The dynamic random access memory as claimed in claim 5, further comprising:
a liner layer at sidewalls of the capacitive contact structure and surrounding the capacitive contact structure, wherein the liner layer is between the second portion and the third portion such that the second portion and the third portion are isolated from each other.

14. The dynamic random access memory as claimed in claim 13, wherein the second contact feature has a first height H1 and the liner layer has a second height H2, wherein the first height H1 has a ratio H1/H2 of 10.0-20.0 with respect to the second height H2.

15. A method for forming the dynamic random access memory of claim 1, comprising:
forming a buried word line in a substrate, wherein the buried word line extends along a first direction;
forming a bit line on a substrate, wherein the bit line extends along a second direction perpendicular to the first direction;
forming a bit line contact structure below the bit line;
forming a capacitive contact structure adjacent to the bit line; and
forming an air gap structure surrounding the capacitive contact structure, wherein the air gap structure comprises:
a first air gap at a first side of the capacitive contact structure, wherein the first air gap exposes a shallow trench isolation structure in the substrate; and
a second air gap at a second side of the capacitive contact structure, wherein the second air gap exposes a top surface of the substrate.

16. The method as claimed in claim 15, wherein forming the air gap structure and forming the capacitive contact structure comprises:
forming an opening adjacent to the bit line;
conformally forming a first liner layer in the opening;
performing a first etching process to remove a portion of the first liner layer and a portion of the shallow trench isolation structure;
forming a first contact feature in the opening, wherein a portion of the first contact feature extends into the shallow trench isolation structure;
performing a second etching process to completely remove the first liner layer, and to remove a portion of the shallow trench isolation structure below the first liner layer;
forming a buffer layer on the first contact feature;
conformally forming a second liner layer in the opening and covering the buffer layer;
performing a third etching process to remove a portion of the second liner layer;
forming a second contact feature on the buffer layer; and
performing a fourth etching process to remove a portion of the second liner layer.

17. The method as claimed in claim 16, further comprising:
performing the fourth etching process until the second liner layer is completely removed.

18. The method as claimed in claim 16, wherein during the second etching process, a removal rate of the first liner layer is greater than a removal rate of the substrate.

19. The method as claimed in claim 16, wherein during the second etching process, a removal rate of the first liner layer is greater than a removal rate of the first contact feature.

20. The method as claimed in claim 16, further comprising:
forming an insulating spacer on sidewalls of the bit line contact structure, wherein after the second etching process, a first portion of the first air gap laterally extends to directly below a bottom surface of the insulating spacer.

* * * * *